(12) United States Patent
Zhao et al.

(10) Patent No.: US 6,937,079 B1
(45) Date of Patent: Aug. 30, 2005

(54) SINGLE-TRANSISTOR-CLOCKED FLIP-FLOP

(75) Inventors: Peiyi Zhao, Lafayette, LA (US); Tarek Darwish, Lafayette, LA (US); Magdy Bayoumi, Lafayette, LA (US)

(73) Assignee: University of Louisiana at Lafayette, Lafayette, LA (US)

( * ) Notice: Subject to any disclaimer, the term of this patent is extended or adjusted under 35 U.S.C. 154(b) by 1 day.

(21) Appl. No.: 10/628,737

(22) Filed: Jul. 28, 2003

(51) Int. Cl.[7] ............................................. H03K 3/356
(52) U.S. Cl. ..................... 327/200; 327/211; 326/98
(58) Field of Search ................................ 327/199–203, 327/205–212, 214–219; 326/46, 93–98; 365/205, 365/154–156

(56) References Cited

U.S. PATENT DOCUMENTS

| | | | | |
|---|---|---|---|---|
| 5,036,217 A | * | 7/1991 | Rollins et al. | 327/203 |
| 5,384,493 A | * | 1/1995 | Furuki | 327/203 |
| 5,453,708 A | | 9/1995 | Gupta et al. | 326/98 |
| 5,557,225 A | | 9/1996 | Denham et al. | 327/199 |
| 5,764,089 A | | 6/1998 | Partovi et al. | 327/200 |
| 5,917,355 A | | 6/1999 | Klass | 327/208 |
| 5,990,717 A | | 11/1999 | Partovi et al. | 327/210 |
| 6,064,246 A | | 5/2000 | Endo et al. | 327/202 |
| 6,069,495 A | * | 5/2000 | Ciccone et al. | 326/98 |

(Continued)

OTHER PUBLICATIONS

Seongmoo Heo, Ronny Krashinsky, and Krste Asanovie, Activity-Sensitive Flip-Flop and Latch Selection for Reduced Energy, 19th Conference on Advanced Research in VLS1, Salt Lake City, UT, Mar. 2001.

Hiroshi Kawaguchi and Takayasu Sakurai, A Reduced Clock-Swing Flip-Flop (RCSFF) for 63% Power Reduction, IEEE Journal of Solid-State Circuits, vol. 33, No. 5, May 1998.

Seongmoo Heo and Krste Asanovie, Load-Sensitive Flip-Flop Characterization, IEEE Journal of Solid-State Circuits, 2001.

Bai-Sun Kong, Sam-Soo Kim, and Young-Hyun Jun, Conditional-Capture Flip-Flop for Statistical Power Reduction, IEEE Journal of Solid-State Circuits, vol. 36, No. 8, Aug. 2001.

Jiren Yuan and Christer Svensson, High-Speed CMOS Circuit Technique, IEEE Journal of Solid-State Circuits, vol. 24, No. 1, Feb. 1989.

Rabaey, J.M.: Digital Integrated Circuits, Chapter 7, "Designing Sequential Logic Circuits", University of California, Berkeley, 2000.

Vladimir Stojanovic and Vojin G. Oklobdzija, Comparative Analysis of Master-Slave Latches and Flip-Flops for High-Performance and Low-Power Systems, IEEE Journal of Solid-State Circuits, vol. 34, No. 4, Apr. 1999.

J. Tschanz, etal., Comparative Delay and Energy of Sgl. Edge-Triggered & Dual Edge-Triggered Pulsed Flip-Flops for Hi-Performance Microprocessors Intn'l Symp. on Low Power Elect and Design, Pp(s): 147-152, 2001.

*Primary Examiner*—Minh Nguyen
(74) *Attorney, Agent, or Firm*—Kean, Miller, Hawthorne, D'Armond, McCowan & Jarman, L.L.P.

(57) ABSTRACT

The invention provides a low power, high performance flip-flop. The flip-flop uses only one clocked transistor. The single clocked transistor is shared by the first and second branches of the device. A pulse generator produces a clock pulse to trigger the flip-flop. In one preferred embodiment the device can be made as a static explicit pulsed flip-flop which employs only two clocked transistors.

8 Claims, 4 Drawing Sheets

U.S. PATENT DOCUMENTS

| | | |
|---|---|---|
| 6,097,323 A * | 8/2000 | Koga et al. .................. 341/100 |
| 6,181,180 B1 | 1/2001 | Chen et al. .................. 327/211 |
| 6,242,952 B1 | 6/2001 | Bosshart et al. ............... 326/98 |
| 6,265,923 B1 | 7/2001 | Amir et al. .................. 327/218 |
| 6,271,701 B1 * | 8/2001 | DiTommaso ................ 327/210 |
| 6,424,195 B2 | 7/2002 | Samala ....................... 327/211 |
| 6,429,711 B1 | 8/2002 | Tschanz et al. .............. 327/211 |
| 6,433,601 B1 | 8/2002 | Ganesan ..................... 327/202 |
| 6,437,624 B1 | 8/2002 | Kojima et al. ............... 327/211 |
| 6,459,316 B1 | 10/2002 | Vangal et al. ................ 327/202 |
| 2002/0036528 A1 | 3/2002 | Afghahi |
| 2002/0140481 A1 | 10/2002 | Tschanz et al. |

* cited by examiner

SINGLE-TRANSISTOR-CLOCKED FLIP-FLOP

STATEMENT REGARDING FEDERALLY SPONSORED RESEARCH OR DEVELOPMENT

This invention was funded in part by the Department of Energy under the EETAPP program, DE97ER12220.

CROSS REFERENCE TO RELATED APPLICATIONS

Not Applicable.

REFERENCE TO A "SEQUENCE LISTING," A TABLE, OR A COMPUTER PROGRAM

Not Applicable.

BACKGROUND OF THE INVENTION

1. Field of the Invention

The present invention relates to clocked circuits for processors. More particularly, the invention relates to a single-transistor-clocked circuit, more especially to a single-transistor-clocked flip-flop.

2. Description of Related Art

Power consumption is a constant concern in modern processors. Processor clock systems, consisting of flip-flops and latches, consume a large amount of power in modern processors. The clocked transistors within a flip-flop have 100% switch activity and present a huge load on the clock distribution network. If one can reduce the number of clocked transistors in a flip-flop, the clock tree will have less capacity load and hence reduce the power consumed in the clock network. This will further result in reducing the number and size of the clock driving buffers, which will in turn cause a significant reduction in the power consumption of the overall system.

One flip-flop well known in the prior art is the ep-DCO, which is described in Tschanz, J. et.al, "*Comparative Delay and Energy of Single Edge-triggered And Dual Edge-triggered Pulsed Flip-flops For High-performance Microprocessors,*" International Symposium on Low Power Electronics and Design, pages 147–152, 2001. Referring to FIG. 1, ep-DCO 100 comprises first branch 135 having transistors 102, 104, 106 connecting in series between first node 127, which is coupled to a high or logic one potential, and second node 117 which is coupled to a low, or logic zero potential. Second branch 133 is provided and includes transistors 108, 110, 112 connected in series between node 127 and node 117.

Inverter chain 119 and latches 121, 125 are also provided in the flip-flop circuit. Inverter chain 119 consists of three inverters connected in series. Clock signal CLK is received at input node 101, which is connected to one input of NAND 116 and the input of inverter chain, 119. Inverter chain 119 is connected in series between node 101 and node 129 and the output of inverter chain 119 is connected to one input of NAND 116. The output of NAND 116 is connected to inverter 114. The output of inverter 114 is connected to the gates of transistors 106, 110. Data signal D is received at data input 105, which is connected to the gate of transistor 104.

Node 107 is defined as the connection between transistors 102, 104. Node 107 is connected to the gates of transistors 108, 112 and to latch 121. Node 109 is defined as the connection between transistors 108, 110 and is connected to latch 125.

In one embodiment of ep-DCO 100, latches 121, 125 comprise back-to-back connecting inverters. Each latch is composed of 2 inverters, with one inverter being weaker than the other. In this embodiment, a latch will retain its value even if disconnected from the rest of the circuit.

In one embodiment of ep-DCO 100 transistors 102, 108 are P type transistors. A P type transistor turns on between its source and its drain when its gate is at a low potential and turns off when its gate is at a high potential.

In one embodiment of ep-DCO 100 transistors 104, 106, 110, 112 are N type transistors. An N type transistor is on between its source and drain when its gate is at a high potential and is open (off) between its source and its drain when its gate is at a low potential.

The operation of prior art flip-flop ep-DCO 100 of FIG. 1 is as follows. The rising edge on signal CLK at input 101 generates a positive edge at transistors 106, 110. The pulse width could be controlled by inverter-chain 119.

During the evaluation period, the clock pulse at node 103 feeds to transistors 106, 110. At the clock pulse rising edge transistors 106, 110 turn on. If the input D at node 105 is high, then transistor 104 is on. The NMOS stage of first branch 135 turns on. Node 107 pulls to GND. PMOS transistor 108 turns on and charges node 109. The signal at node 109 therefore pulls up to high.

Conversely, if the input D at node 105 is low, then transistor 104 turns off. The NMOS stack of first branch 135 will turn off as well. Signal X (the output of first branch 135 of ep-DCO 100) at node 107 is high because node 107 was pre-charged by the previous cycle. Transistor 112 turns on when the clock pulse is high, as will transistor 110. Node 109 will be pulled down to the low state.

During the pre-charge period (i.e. when clock signal CLK is low), transistor 102 is on and pulls signal X at internal node 107 to high. Transistors 106, 110 will turn off and both the NMOS stacks of the two branches are off. The output at node 109 is kept by latch (keeper) 125.

While flip-flop 100 is adequate for performing the clock function in a processor, it has limitations. There is constant and redundant switching activity at internal node 107. This undesirable switching activity occurs because node 107 is pre-charging and discharging even when D is kept high. Additionally, glitches appear at the output node that could cause noise problems in the subsequent circuits. Additionally, ep-DCO 100 consumes relatively large amounts of power because of the three clocked transistors that are used. Clocked transistors are those whose gates are connected to receive a clock pulse.

It is an object of the present invention to provide a flip-flop that minimizes redundant switching activity.

It is an object of the present invention to provide a flip-flop that prevents glitches at the output node.

It is another object of the invention to provide a flip-flop that consumes less power than current flip-flop devices.

BRIEF SUMMARY OF THE INVENTION

A single-transistor-clocked flip-flop is provided. The device has two branches, each of which has two transistors connected in series to a third transistor that is shared with the other branch. The shared transistor is connected to a pulse generator. In a preferred embodiment the device can be configured as a static explicit pulsed flip-flop which uses only two clocked transistors. The present invention has several novel features and advantages when compared to prior art systems.

One feature of the present invention is that it eliminates redundant switching activity within the flip-flop.

Another feature of the present invention is that it minimizes or prevents glitches at the output node.

Another feature of the present invention is that it uses less power than the prior art flip-flops.

Advantage of the invention is that it uses fewer transistors.

An additional advantage of the invention is that it is easier to construct because it uses fewer transistors.

These and other objects, advantages, and features of this invention will be apparent from the following description.

DETAILED DESCRIPTION OF THE INVENTION

In the following detailed description of the embodiments reference is made to the accompanying drawings. The drawings are intended to show, by way of illustration, specific embodiments in which the invention may be practiced. It is to be understood that other embodiments of the invention may be utilized and structural changes may be made without departing from the scope of the present invention.

Figure 2:
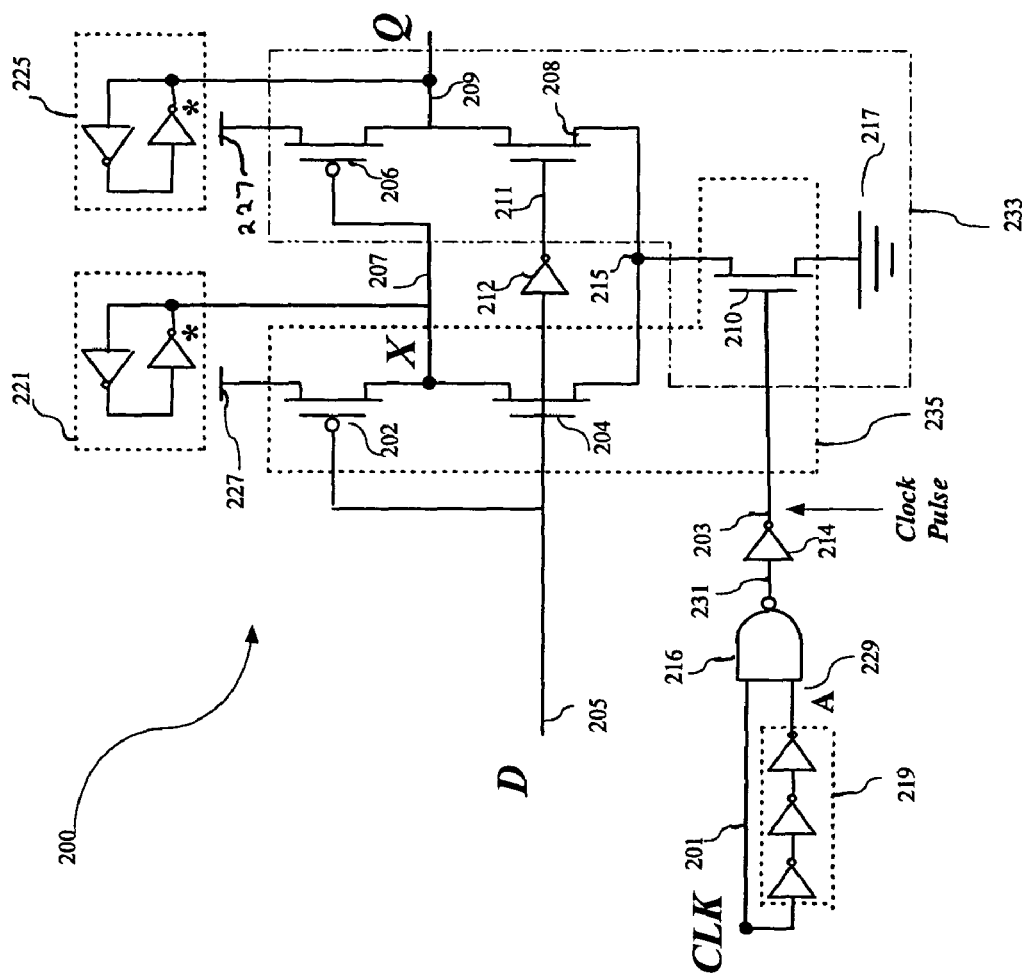
FIG. 2 is a circuit diagram of one preferred embodiment of the invention.

Referring to FIG. 2, a flip-flop is shown that is an embodiment of the present invention. Flip-flop 200 comprises first branch 235, second branch 233, and pulse generator 240 (includes components 214, 216, 219). First branch 235 includes first branch transistors 202, 204 and shared transistor 210 connecting in series between first node 227, which is coupled to a high or logic one potential, and a second node 217 which is coupled to a low, or logic zero potential. Second branch 233 is provided and shares shared transistor 210 with first branch 235. In addition to shared transistor 210, second branch 233 includes second branch transistors 206, 208 which are connected in series between first node 227 and second node 217.

Inverter chain 219 (which comprises a series connection of three inverters), first branch latch 221, and second branch latch 225 are also provided in the flip-flop circuit. Clock signal CLK is input at input node 201, which is connected to the input of NAND 216 and input of inverter chain, 219. Inverter chain 219 is connected in series between node 201 and node 229. Node 229 is in turn connected to one input of NAND 216. The output of NAND 216 is connected to inverter 214. The output of inverter 214 is the Clock Pulse.

Inverter chain 219, NAND 216, and inverter 214 together make up pulse generator 240. The output of inverter 214 is connected to the gate of shared transistor 210. Data signal D is input at data input 205, which is connected to the gates of first branch transistors 202, 204 and to the input of data inverter 212. Data inverter 212 is between node 211 and data input 205. The output of data inverter 212 is Db, the complement of D. Node 211 is connected to the gate of transistor 208.

Source node 215 is defined as the common connection between the sources of transistors 204, 208, 210. Internal signal node 207 is defined as the connection between transistors 202, 204, the gate of transistor 206, and first branch latch 221. Node 209 is defined as the connection between transistors 206, 208 and second branch latch 225.

In one embodiment latches 221, 225 comprise back-to-back connecting inverters. One inverter is selected to be weaker than the other. For this embodiment, the latch will retain its value even if disconnected from the rest of the circuit.

In one embodiment, transistors 202, 206 are P type transistors, each of which turns on between its source and drain when its gate is at a low potential and turn off when its gate is at a high potential. In that same embodiment, transistor 210 is an N type transistor which is on between its source and drain when its gate is at a high potential and which is open (off) between its source and drain when its gate is at a low potential. In the embodiment of FIG. 2 transistors 204, 208 are N types as well.

The operation of flip-flop 200 will now be described with reference to FIG. 2. The rising edge on CLK signal at input node 201 generates a positive edge at the gate of transistor 210. The pulse width could be controlled by inverter chain 219.

When the Clock Pulse generated at node 203 feeds a Clock Pulse rising edge to the gate of transistor 210, transistor 210 turns on. If input D at node 205 is high, D at node 211 will be low, transistor 204 will be on, and transistor 208 will be off. Therefore, when D is high at 205 the NMOS stage of the first branch will be turned on. Further analyzing the state of the devices when D is high, we find that because transistors 204 and 210 are on, internal signal node 207 will pull to GND. Therefore PMOS transistor 206 turns on and charges node 209 up to high.

If D at node 205 is low, Db at node 211 is high and transistor 204 turns off. The NMOS stack of the first branch turns off as well. Transistor 208 turns on when the Clock Pulse is high; transistor 210 is on as well, and therefore node 209 pulls down to low. When the Clock Pulse is low shared transistor 210 turns off and both the NMOS stacks of the two branches are off. The output at node 209 is kept by latch (keeper) 225.

Figure 3:
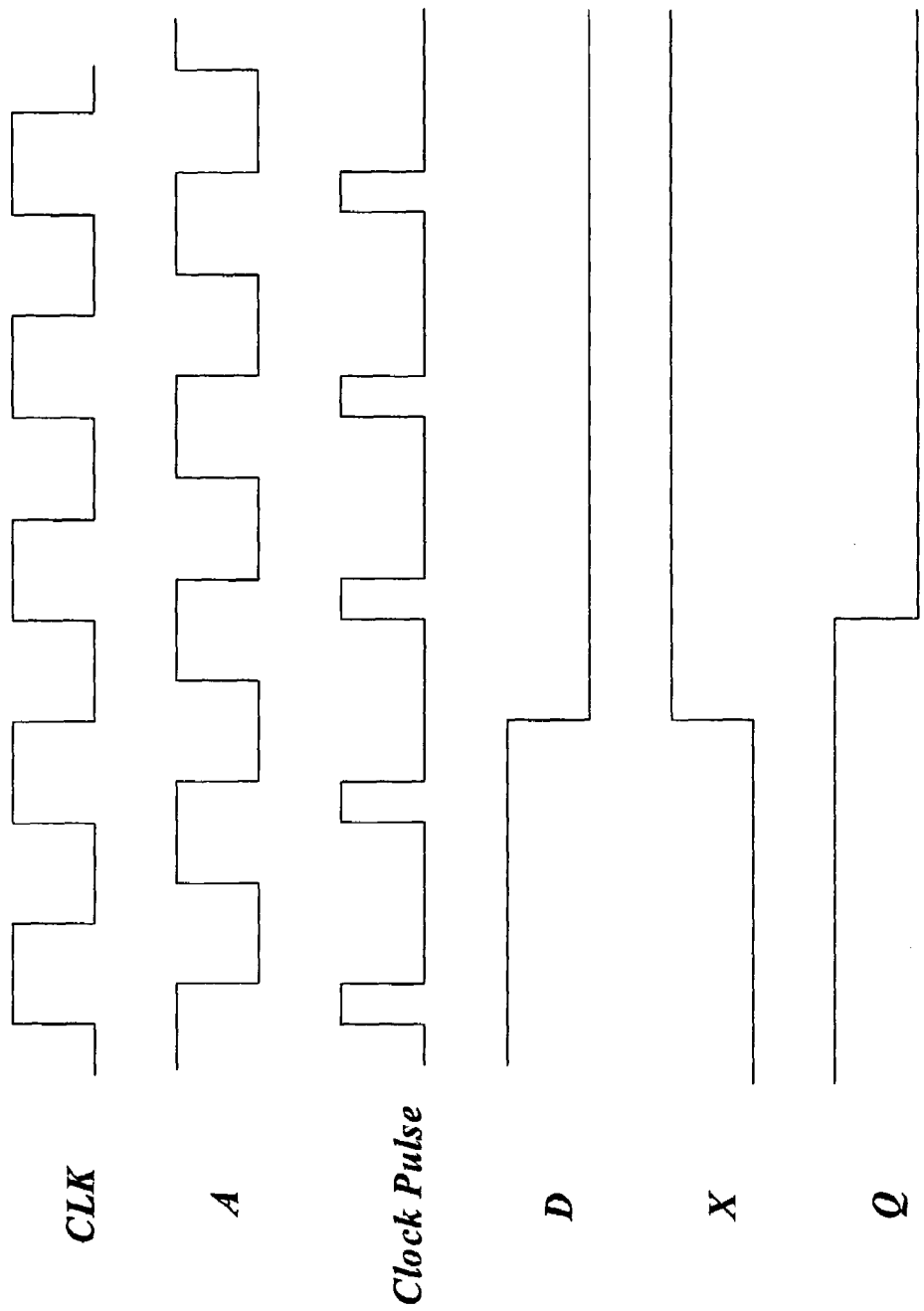
FIG. 3 depicts a timing diagram that corresponds to the embodiment of the invention depicted in FIG. 2.

A timing diagram for the flip-flop embodiment 200 is shown in FIG. 3. The following items are shown: input clock signal CLK from node 201; the input data D at node 205, output Q (the output of flip-flop 200) at node 209, internal signal X (the output of first branch 235) at internal signal node 207; and Clock Pulse at node 203. The Clock Pulse is generated when input node 229 of NAND gate 216 is delayed by inverter 219 with respect to input node 201. NAND gate 216 will therefore output a falling edge pulse at node 231, which connects to the gates of inverter 214 when input nodes 229 and CLK are both high. Inverter 214 will then output a rising edge pulse to transistor 210, and transistor 210 will turn on. When D at node 205 is high, transistor 204 turns on and internal signal node 207 discharges to low by transistors 204, 210. If X is low, then transistor 206 turns on and pulls node 209 to high.

If transistor 204 is off and node 211 is high, transistor 208 turns on, and node 209 is discharged to low by transistors 208, 210. When the Clock Pulse at 203 is low, transistor 210 turns off and the NMOS stacks in both the first and second branches turn off. Output Q at node 209 is thus decoupled from input data D.

Figure 1:
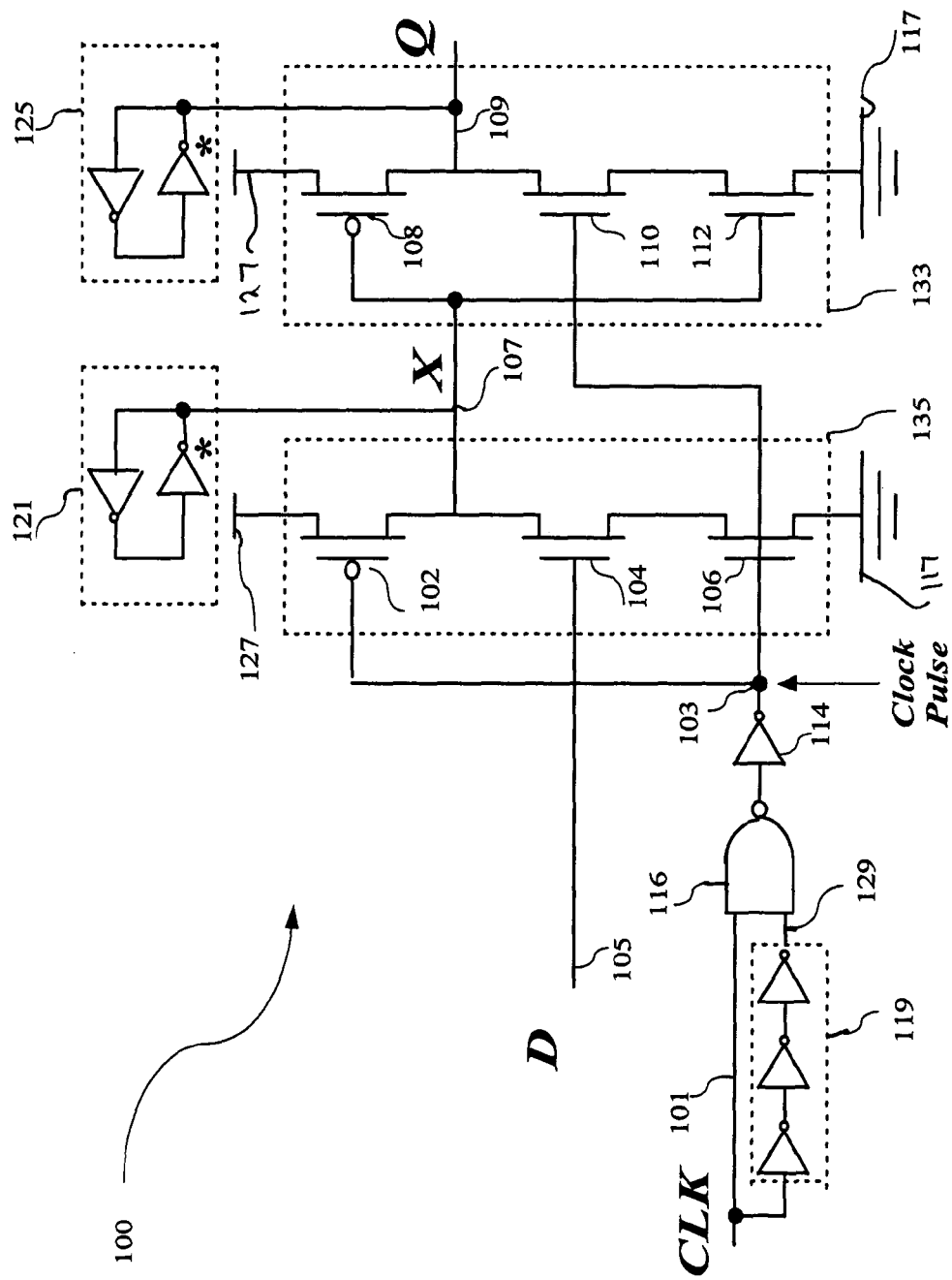
FIG. 1 is a circuit diagram of a flip-flop known in the prior art.

Flip-flop 200 has many advantages over prior art systems such as ep-DCO 100 shown in FIG. 1. For example, the internal node redundant switching is eliminated as compared with ep-DCO 100. An additional feature of flip-flop 200 is that low swing clock can be applied. First branch 235 drives only one PMOS transistor, transistor 206. Therefore the capacity load on node X is smaller than the load found in the ep-DCO device. The lower load helps increase the speed of flip-flop 200. The dual path topology can drive a large capacity load at output Q. A further advantage of flip-flop 200 is that a double edge can be employed by applying a double edge pulse generator.

In an alternate embodiment, transistors 202, 206 are selected as NMOS devices and transistors 204, 208 are PMOS devices. In this alternate embodiment transistor 210 will still be a P type transistor. In this alternate embodiment first node 227 would be set to low and second node 217 would set to high potential. Additionally, the drains of transistors 204, 208 would be connected to the drain of shared transistor 210 at node 217, which would then be known as a drain node.

Figure 4:
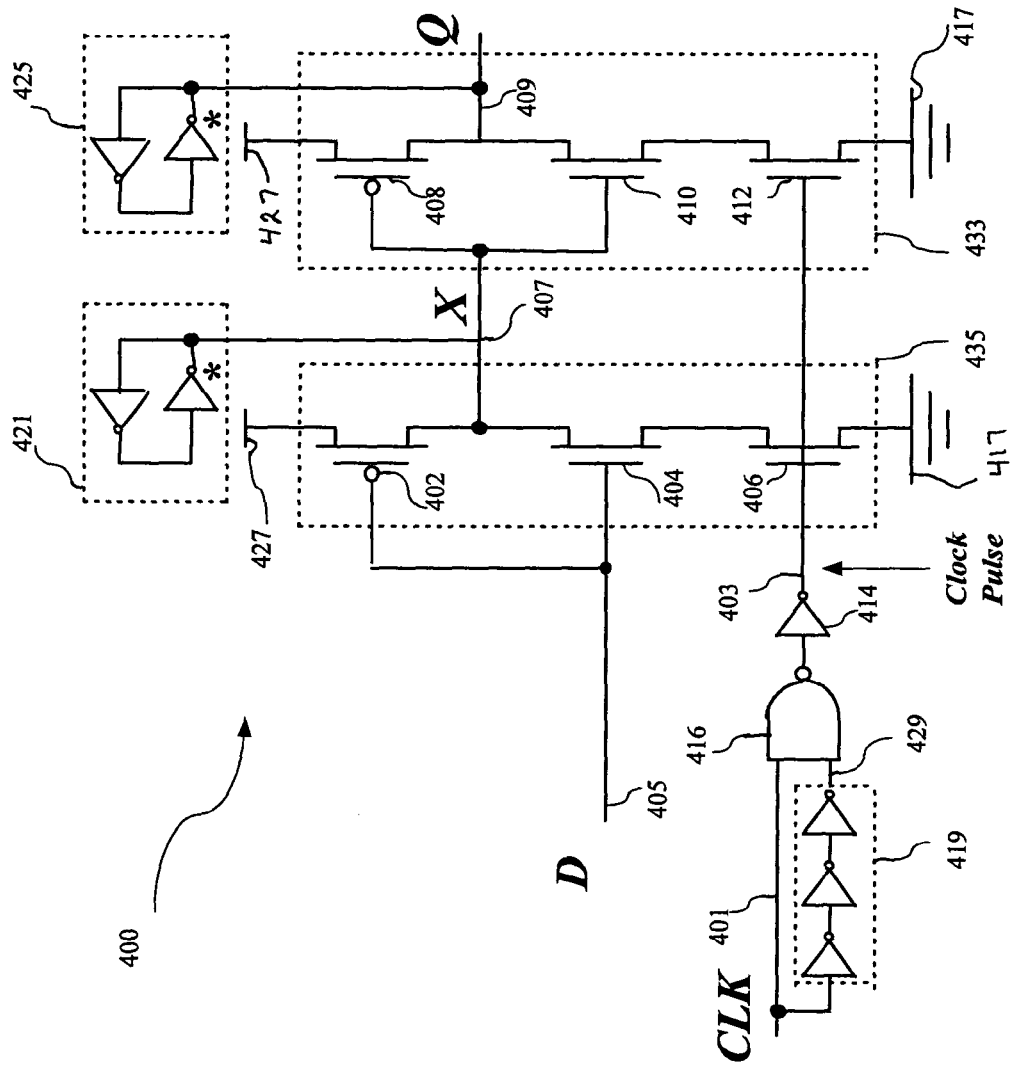
FIG. 4 depicts an embodiment of the invention that includes the static explicit pulsed flip-flop.

FIG. 4 depicts a circuit diagram of another embodiment of the invention. The embodiment of FIG. 4 is static explicit pulsed flip-flop 400. Static explicit pulsed flip-flop 400 comprises first branch 435, second branch 433, and a pulse generator that consists of inverter chain 419, NAND 416, and inverter 414. First branch 435 includes transistors 402, 404 and clocked transistor 406 which are connected in series between first node 427, which is coupled to a high or logic one potential, and second node 417 which is coupled to a low, or logic zero potential. Second branch 433 is provided and includes transistors 408, 410 and clocked transistor 412 which are connected in series between first node 427 and second node 417.

First branch latch 421 and second branch latch 425 are also provided in the circuit of flip-flop 400. Clock signal CLK is received at input node 401, which is connected to one input of NAND 416 and to the input of inverter chain 419. Inverter chain 419 is connected in series between the node 401 and node 429 and the output of inverter chain 419 is connected to one input of NAND 416. The output of NAND 416 is connected to inverter 414. The output of inverter 414 is connected to the gates of clocked transistors 406, 412. Data input signal D is received at node 405, which is connected to the gates of transistors 402, 404.

Node 407 is defined as the connection between transistors 402, 404. Node 407 is also connected to the gates of transistors 408, 410 and to latch 421. Node 409 is defined as the connection between transistors 408, 410 and is connected to latch 425.

In one embodiment latches 421, 425 comprise back-to-back connecting inverters (one inverter is weaker than the other). In this embodiment, a latch will retain its value even if disconnected from the rest of the circuit.

Transistors 402, 408 in one embodiment are P type transistors which turn on between their source & drain when their gates are at a low potential and which turn off when their gates are at a high potential. Transistors 404, 406, 410, 412 in one embodiment are N type transistors, each of which is on between its source and drain when its gate is at a high potential and which is open (off) between its source and drain when its gate is at a low potential.

Static explicit pulsed flip-flop 400 operates as follows. The rising edge on CLK signal 401 generates a positive edge at clocked transistors 406, 412. The pulse width could be controlled by inverter-chain 419.

During the evaluation period, Clock Pulse at node 403 feeds to clocked transistors 406, 412. At the rising edge of the Clock Pulse, clocked transistors 406, 412 turn on. If D at node 405 is high, then transistor 404 is on, so the NMOS stage of the first branch turns on. Node 407 pulls to GND. PMOS transistor 408 turns on and charges node 409 up to high. If data signal D at node 405 is low, then transistor 404 turns off. The NMOS stack of 1st branch turns off as well. X at node 407 will be high because node 407 is charged by PMOS transistor 402. With X at a high potential, NMOS transistor 410 turns on. When the Clock Pulse is high, transistor 412 is on as well, and node 409 pulls down to low.

During the hold period (i.e. the Clock Pulse is low), clocked transistors 406, 412 turn off, and the NMOS stacks in both the first branch and the second branch are off. Output Q at node 409 is kept by latch (keeper) 425.

Clocked transistors are those whose gates are connected to receive a clock pulse.

As shown in FIG. 4, the number of clocked transistors in static explicit pulsed flip-flop 400 is two, as compared to three clocked transistors as shown in the prior art device of FIG. 1. Therefore the power dissipation in the clock distribution network will be decreased.

Low swing or double edge clocking, or both, could be used to further reduce power consumption in flip-flop 200 and static explicit pulsed flip-flop 400. As with flip-flop 200, one could switch the one and zero logic potentials and the N and P type transistors and have an alternate design of static explicit pulsed flip 400.

The above technique reduces the clocked transistors in the flip-flop and therefore the clocked tree has less clocked capacity load to drive. This reduction of capacity load shrinks the size of the overall clock distribution network, so that a significant decrease in power consumption can be realized. It is clear that these flip-flops are suitable for low power, high performance digital systems.

There are of course other alternate embodiments that are obvious from the foregoing descriptions of the invention, which are intended to be included within the scope of the invention, as defined by the following claims.

We claim:

1. A flip-flop circuit comprising:
   (a) a first branch having two transistors in series and a first branch source node, said first branch comprising a P-type transistor and an N-type transistor connected in series, the source of said N-type transistor being connected to said first branch source node and the drain of said P-type transistor being connected to a high potential;
   (b) a second branch having two transistors in series and a second branch source node, said second branch comprising a P-type transistor and an N-type transistor connected in series, the source of said N-type transistor being connected to said second branch source node and the drain of said P-type transistor being connected to said high potential, said second branch source node being common with said first branch source node;
   (c) a shared transistor having its source connected to said first branch source node and said second branch source node;
   (d) a pulse generator connected to the gate of said shared transistor; and (e) wherein the source of said first branch P-type transistor is connected to a first branch latch and the source of said second branch P-type transistor is connected to a second branch latch.

2. The flip-flop circuit of claim 1 wherein said latches include means for retaining the value in said latches even when disconnected from the circuit.

3. The flip-flop circuit of claim 2 wherein said value retaining means includes back to back inverters, one inverter being selected to be weaker than the other inverter.

4. The flip-flop circuit of claim 1 further comprising:
(a) a data signal input connected to the gates of said first branch P type transistor and said first branch N type transistor; and
(b) a data inverter having an input and an output, said data inverter input connected to said data signal input and said data inverter output connected to the gate of said second branch N type transistor.

5. A flip-flop circuit comprising:
(a) a first branch having two transistors in series and a source node;
(b) a second branch having two transistors in series and a source node, said source node being common with said source node of said first branch;
(c) a shared transistor having its source connected to said source nodes of said first and second branches; and
(d) a pulse generator connected to the gate of said shared transistor; said pulse generator comprising:
  (i) an inverter chain having
    (1) an input node for receiving a clock signal; and
    (2) an output;
  (ii) a NAND having an output and two inputs, one of said NAND inputs connected to said inverter chain input node and the other of said NAND inputs connected to said output of said inverter chain; and
  (iii) an inverter having an input and an output, said inverter input connected to said output of said NAND and said inverter output connected to the gate of said shared transistor.

6. A static explicit pulsed flip-flop circuit comprising:
(a) a first branch having three transistors in series, one of said first branch transistors being a clocked transistor and the other two transistors being non-clocked transistors having their gates connected to a data input;
(b) a second branch having three transistors in series, one of said second branch transistors being a clocked transistor and the other two transistors being non-clocked transistors having their gates connected to a node between said first branch non-clocked transistors;
(c) a pulse generator connected to the gates of said clocked transistors in said first and second branches; and
(d) wherein said gates of said second branch non-clocked transistors are connected to a first branch latch and a second branch latch is connected between said second branch non-clocked transistors.

7. The flip-flop circuit of claim 6 wherein said latches include means for retaining the value in said latches even when disconnected from the circuit.

8. The flip-flop circuit of claim 7 wherein said value retaining means includes back to back inverters, one inverter being selected to be weaker than the other inverter.

* * * * *